United States Patent Office 3,162,526

Patented Dec. 22, 1964

3,162,526
METHOD OF DOPING SEMICONDUCTOR MATERIALS

Milton C. Vanik, Baltimore, Md., assignor to W. R. Grace & Co., New York, N.Y., a corporation of Connecticut No Drawing. Filed Sept. 11, 1963, Ser. No. 308,310
16 Claims. (Cl. 75—65)

This invention relates to an improved method for adding controlled amounts of alloying materials to semiconductor bodies. More particularly, the invention relates to the addition of resistivity-type-determining impurities to a body, e.g., a rod or bar, of semiconductor material such as silicon or germanium.

This application is a continuation-in-part of my copending application, Serial No. 147,753, filed October 26, 1961, now abandoned.

It is known that the resistivity type of semiconductive materials can be controlled by introducing into a body of such materials very small controlled amounts of certain impurities. This introduction of impurities is commonly referred to as "doping" the semiconductive material. The type of resistivity created in the doped semiconductor is dependent upon the electron configuration of the atoms of the impurity introduced, and the excess of one type of impurity over another type in the semi-conductive material. Thus, an impurity whose atoms carry an extra electron which is releasable to the atoms of the particular semiconductive material treated is called a "donor" impurity. Since the semiconductor containing a donor impurity has a surplus of electrons available for carrying a current, the semiconductor is said to have a negative or N-type resistivity. In a similar manner an impurity whose atoms are deficient in electrons and thus are capable of accepting electrons from the crystal lattice of the semiconductive material is called an "acceptor" impurity. The electron vacancy creates a "hole" or positive current carrier. A semiconductor doped with such an impurity is said to have a positive or P-type resistivity. A simplified and lucid discussion of the two types of semiconductors can be found in Business Week, March 26, 1960, at page 76. The type of resistivity of a semiconductor containing both donor and acceptor impurities at the same time will depend upon which impurity is in excess of the other.

Suitable impurities changing the resistivity and type of resistivity of silicon and germanium are the elements of Group 3 of the periodic table including boron, gallium, aluminum, indium or the like, all of which serve as acceptor impurities and thus create P-type resistivity; and the elements of Group 5 of the periodic table, e.g., phosphorus, arsenic, antimony or bismuth, all of which serve as donor impurities and create N-type resistivity. Other elements have also been used. The most commonly used N-type doping elements are phosphorus and arsenic. The most commonly used P-type dopant is boron. The doping elements may be added in the elemental form or in the form of any alloy or compound which will result in addition of the elements to the crystal lattice of the semiconductor produced.

One of the most convenient and efficient methods of doping a semiconductor material is the so-called "gas-doping" process. In this process, the doping substance in the gas state is carried in a main stream of an inert gas such as argon, hydrogen, helium or the like into contact with an elongated semi-conductive body which is being zone-refined. The gaseous donor or acceptor impurity reacts or diffuses into the molten zone of semiconductor material. As the molten zone traverses the length of the body, the impurity becomes distributed throughout the body which is simultaneously refined. The gaseous doping substance used can be chloride, e.g., boron trichloride, phosphorus tri- or pentachloride or the like.

Many problems have been encountered in attempting to obtain suitable products by the gas doping process described. The doping substances used are highly reactive with almost all types of apparatus in which the zone refining is performed. Boron trichloride for example, will rapidly react with the metal parts of the zone refiner. Furthermore, the doping substances are reactive with the residual moisture and other impurities contained in the inert carrier gas. These problems are made even more weighty by the fact that gas doping during zone refining must by necessity be performed with extremely low concentration of doping substance, on the order of several parts per billion, in order to avoid introduction of excess impurity into the semiconductor body. At concentrations in this range, any doping substance lost as a result of reaction with the apparatus or carrier gas impurities becomes extremely significant. As a consequence, it has been difficult to obtain reproducible results in the present processes. Furthermore, the resistivity profiles of the doped semiconductors, which should be as level as possible (so the semiconductor will have essentially constant electrical properties throughout its length), will show considerable fluctuation. One further problem with the prior art process is that it is limited to the doping of only one semiconductive rod or bar at a time, since the doping process requires that the rod or bar to be doped is simultaneously zone refined.

It is an object of this invention to solve the prior art problems noted. It is a further object of this invention to provide a process for gas doping of semiconductive bodies in which the concentration of doping substance is not critical. It is another object of this invention to provide a process where the loss of doping substance through reaction with the apparatus used or with impurities in the carrier gas has no noticeable effect on the resistivity profiles of the doped semiconductor product, nor on the reproducibility or results of the doping process. Another object of this invention is to provide a gas doping in which many semiconductor rods or other bodies can be doped at one time. Other objects will be apparent to those skilled in the art in view of the following more detailed description.

In accordance with this invention, it has been found that the above objects can be achieved in a gas doping process which comprises heating a semiconductive body to a temperature which is no greater than about 50° C. below its melting point, passing an inert carrier gas containing from about 0.10 to about 10 volume percent of doping substance over the heated rod for a sufficient period of time to react said doping substance with the surface of said semiconductive body, cooling the surface-reacted semiconductive body to about ambient temperature, and then zone refining said surface-reacted body.

In the process of this invention, the amount of doping substance is very substantial as compared to know processes of gas doping directly during the zone refining operation. As a result, the amount of doping substance that might be lost through reaction with impurities in the inert carrier gas has no detectable effect upon the amount of substance added to the semiconductive body being doped. The volume percent of doping substance in the carrier gas can be varied over a relatively large range in order to achieve the desired degree of doping. Preferred concentrations are from about 0.10 to about 3.0 percent by volume. Doping substances which can be used in the process of this invention include any gaseous elements of groups 3 and 5 of the periodic table as well as any compounds or alloys of these elements having a sufficient vapor pressure to permit them to be carried in the inert carrier gas stream. Preferred doping substances include the halides of said elements, such as boron trichloride, phosphorus trichloride, gallium trichloride, antimony trichloride, phosphorus pentachloride and arsenic trichloride. Also especially suitable are the various forms of elemental phosphorous, e.g., red phosphorus, having the vapor pressure characteristics stated above. As inert carrier gas there may be used helium, hydrogen, argon, neon or the like, or mixtures thereof. Any inert gas which is nonreactive with the semi-conductive body and which will prevent contamination of the semiconductor by the surrounding atmosphere may be used in this invention. The preferred inert carrier gas is argon.

The quantity of doping substance which reacts with the surface of the heated semiconductive body depends upon the temperature of the body at the time that the body is contacted with the doping gas stream and the concentration of doping substance in the gas stream. The particular conditions, i.e., the time, temperature, and amount of doping substance, required to achieve any specific doping level can be readily determined by a few empirical tests. Zone refining the surface-reacted semiconductor body distributes the doping impurity throughout the bulk of the semiconductive body.

The temperature to which the semiconductive body is heated is broadly not critical so long as the body is maintained at a temperature not greater than about 50° C. below its melting point. The minimum permissible temperature for any given case will be simply that temperature usually needed to cause some reaction between the doping substance and the surface of the body to be doped. If the body is molten or is heated to a temperature too near its melting point excessive quantities of doping substance will react with the surface of the body thus essentially preventing obtainment of the desired results. As will be obvious, heating the body to higher temperatures permits use of shorter contact times and lower doping substance concentrations. But at higher temperatures, greater control of the time-temperature-concentration relationship must be exercised to avoid the possible overdoping results noted above.

Since the amount of doping substance reacted with the surface of the semiconductor body depends on the temperature of the body, it is possible to heat a body nonuniformly so as to add a doping impurity to the body in a non-uniform distribution and thereby achieve a commercially acceptable uniform resistivity profile, i.e., a resistivity profile which does not vary more than ±10% from a given value over the entire length of the body. Thus, for example, an elongated semiconductive body prepared by contacting a seed crystal with a molten bath of semiconductor material and then slowly drawing the seed crystal away from the bath (see as an example of such as process, Emeis, U.S. Patent 2,793,103) will generally be deficient in resistivity-type-determining impurities at the seed end. Such a body could be suitably doped by establishing a temperature gradient in the body with the higher temperature at the seed end so that larger amounts of doping substance will react with the surface of the body at the seed end and be distributed in the body by zone refining. Such procedures are particularly adaptable to the process of the present invention when the segregation coefficient of the doping impurity is near unity, since in such case zone refining of the surface reacted body will distribute the doping impurity in the rod in essentially the same manner as the doping substance is distributed on the surface of the rod. When the segregation coefficient of the doping impurity is appreciably less than unity, e.g., less than about 0.7, then the establishment of a suitable temperature gradient along the body to be surface-reacted can be used in a like manner to compensate for the exponential removal of doping impurity from one end of the body and accumulation in the other end of the body that occurs during zone refining.

The process of the present invention is equally applicable to doping of semiconductive bodies with P- or N-type impurities. The process is especially adaptable to doping with impurities whose segregation coefficient is close to unity (e.g., greater than about 0.8) since in such case subsequent zone refining distributes the doping impurity in the semiconductive body in essentially the same amounts that it has been distributed on the body surface, and control of the surface distribution is easily achieved.

The process of the instant invention does not require simultaneous doping and zone refining of the semiconductive body and thus can be used to dope many bodies at one time.

The invention will be further illustrated by the following specific examples, which should not be construed as limiting the invention other than as defined in the appended claims. In the examples the amounts of doping impurity added by the gas doping process were calculated by use of the standard formula:

$$\text{Impurity added (in parts per billion)} = \frac{K}{\text{Resistivity}}$$

where K for P-type impurities, such as boron, is 290 and for N-type impurities, such as phosphorus, is 65. These values for the constant K are based upon the most accurate mobility data presently available.

EXAMPLE 1

In this example the semiconductive body to be doped was a silicon rod about ⅞-inch in diameter and about 8 inches long. The rod had previously been vacuum zone refined to remove all N-type impurities, but still contained residual amounts of boron. The rod was etched (with a mixture of 3 parts by volume of a 50% by weight aqueous solution of hydrofluoric acid and 1 part by volume of a 70% by weight aqueous solution of nitric acid), dried and mounted on a glass support in a 55-millimeter Pyrex tube which had an inlet opening in one end and an outlet opening at the other end to permit flow of the doping gas therethrough. The Pyrex tube was in turn mounted in a tubular furnace having an 18-inch heating zone. The furnace temperature was raised to 520–525° C. and argon was metered through the Pyrex tube at a rate of about 2,600 cubic centimeters per minute. After equilibrium had been established, a stream of boron trichloride flowing at a rate of 6.6 cubic centimeters per minute was fed into the stream of argon gas and carried by the argon into contact with the heated rod. After about 30 minutes the boron trichloride flow was stopped, the furnace was shut off and the rod cooled to ambient temperatures while maintaining the argon flow. The cooled rod was then removed from the Pyrex and subjected to a single pass float zone refinement under vacuum in the conventional manner. Resistivity measurements along the length of the rod prior to and following the doping process are recorded in Table I below.

*Table I*

| Distance from Seed End of Rod (Centimeters) | Resistivity in Ohm-Centimeters | |
|---|---|---|
| | Original | After Doping |
| 2 | 185 | 101 |
| 4 | 140 | 85 |
| 6 | 130 | 63 |
| 8 | 120 | 64 |
| 10 | 120 | 68 |
| 12 | 113 | 61 |
| 14 | 117 | 61 |
| 16 | 118 | 58 |
| 18 | 117 | 57 |
| 20 | 91 | 59 |

The rapidly descending resistivity at the beginning end of the crystal is due to the seed effect. Disregarding this seed end and considering only the plateau region of the resistivity profile, it was determined by use of the standard formula shown above that about 2.4 parts per billion of boron had been uniformly added to the rod.

Since boron has a segregation coefficient of about .9 and is not segregated to any significant degree during zone refining, it was concluded that the boron trichloride had reacted with the surface of the furnace heated rod in the same uniform manner. It is to be noted that the resistivity profile of the doped rod is essentially level and easily within the commercial tolerance of ±10% over most of the rod length.

EXAMPLE 2

The silicon rod doped as described in Example 1 was further doped by using the same procedure except that the furnace temperature was maintained at about 530–535° C. and the flow of boron trichloride was continued for about one hour instead of 30 minutes. After cooling, the redoped rod was zone-refined in the same manner described in Example 1. Resistivity measurements gave the following results.

| Distance from seed (centimeters): | Resistivity (ohm-centimeters) |
|---|---|
| 2 | 34 |
| 4 | 35 |
| 6 | 28 |
| 8 | 30 |
| 10 | 28 |
| 12 | 28 |
| 14 | 25 |
| 16 | 28 |
| 18 | 34 |
| 20 | 34 |

It was calculated that about 5.3 parts per billion of boron had been uniformly added to the rod in the second doping treatment.

EXAMPLE 3

The silicon rod of Example 2 was further doped at a temperature of 450° F. by the procedure described in Example 2. Approximately 3.7 parts per billion of boron were uniformly added to the rod in this treatment. Resistivity measurements gave the following results.

| Distance from seed (centimeters): | Resistivity (ohm-centimeters) |
|---|---|
| 2 | 24 |
| 4 | 23 |
| 8 | 21 |
| 10 | 21 |
| 14 | 19 |
| 16 | 20 |
| 18 | 24 |
| 20 | 24 |

It is to be understood that although the examples show only the doping of silicon rods the process of this invention is equally applicable to the doping of bars, ingots or other bodies of other semiconductive materials, including germanium, the alloy semiconductors, e.g., aluminum antimonide and other like materials such as those described in Welker U.S. Patent 2,798,989; and the like. It is also understood that gaseous doping substances other than those specifically mentioned herein can be used if desired. All such variations of the process of this invention as are obvious to those skilled in the art are to be deemed within the spirit and scope of the invention as it is defined in the appended claims.

The doped semiconductive bodies produced by the process of this invention are suitable for use in preparing such devices as crystal diodes, transistors and the like.

What is claimed is:

1. Process for doping semiconductive bodies which comprises heating a semiconductive body to a temperature no greater than about 50° C. below its melting point, passing over said heated body an inert carrier gas containing from about 0.1 to about 10 percent by volume of a doping substance, said gas being passed over said body for a sufficient period of time to react said doping substance with said body, cooling the surface-reacted body to ambient temperatures, and zone-refining said cooled surface-reacted body.

2. Process for doping semiconductive bodies which comprises heating a semiconductive body to a temperature no greater than about 50° C. below its melting point, passing over said heated body an inert carrier gas containing about 0.1 to about 10 percent by volume of a doping substance, said gas being passed over said body for a sufficient period of time to react said doping substance with said body, cooling the surface-reacted body to ambient temperatures in the presence of an inert gas free from doping substance, and zone refining said cooled surface-reacted body.

3. Process as defined in claim 2 wherein said semiconductive body is a silicon rod.

4. Process as defined in claim 3 wherein said inert gas is argon.

5. Process as defined in claim 4 wherein said doping substance is selected from the group consisting of chlorides of elements in Group 3 of the periodic table and chlorides of elements in Group 5 of the periodic table.

6. Process as defined in claim 5 wherein said doping substance is boron trichloride.

7. Process as defined in claim 5 wherein said doping substance is gallium trichloride.

8. Process as defined in claim 5 wherein said doping substance is phosphorus pentachloride.

9. Process as defined in claim 5 wherein said doping substance is phosphorus trichloride.

10. Process as defined in claim 5 wherein said doping substance is arsenic trichloride.

11. Process for doping an elongated semiconductive body which comprises heating said body to a temperature no greater than about 50° C. below its melting point, said heating being conducted in such manner to establish a temperature gradient along the length of said body, passing over said heated body an inert carrier gas containing from about 0.1 to about 10 percent by volume of a doping substance, said gas being passed over said body for a sufficient period of time to react said doping substance with said body, cooling the surface-reacted body to ambient temperatures, and zone refining said cooled surface-reacted body.

12. Process as defined in claim 11 where said elongated semiconductive body is a silicon rod.

13. Process as defined in claim 12 wherein said inert gas is argon.

14. Process as defined in claim 13 wherein said doping substance is boron trichloride.

15. Process as defined in claim 13 wherein said doping substance is phosphorous trichloride.

16. Process as defined in claim 13 wherein said doping substance is phosphorous pentachloride.

References Cited by the Examiner

UNITED STATES PATENTS

| | | | |
|---|---|---|---|
| 2,739,088 | 3/56 | Pfann | 75—65 |
| 2,759,855 | 8/56 | Medcalf | 148—174 |
| 2,854,363 | 9/58 | Seiler | 148—189 |
| 3,007,816 | 11/61 | McNamara | 252—62.3 |

BENJAMIN HENKIN, *Primary Examiner.*